United States Patent
Gregory

[11] Patent Number: 6,069,034
[45] Date of Patent: May 30, 2000

[54] DMOS ARCHITECTURE USING LOW N-SOURCE DOSE CO-DRIVEN WITH P-BODY IMPLANT COMPATIBLE WITH E²PROM CORE PROCESS

[75] Inventor: Haydn James Gregory, Palo Alto, Calif.

[73] Assignee: National Semiconductor Corporation, Santa Clara, Calif.

[21] Appl. No.: 09/146,641

[22] Filed: Sep. 3, 1998

[51] Int. Cl.⁷ .................................................. H01L 21/8247
[52] U.S. Cl. .......................... 438/201; 438/262; 438/268
[58] Field of Search .................................. 438/201, 258, 438/262, 263, 268, 279, 282, 545, 546

[56] References Cited

U.S. PATENT DOCUMENTS

| | | | |
|---|---|---|---|
| 5,338,693 | 8/1994 | Kinzer et al. ............................ | 438/268 |
| 5,340,756 | 8/1994 | Nagayasu .................................. | 437/34 |
| 5,550,072 | 8/1996 | Cacharelis et al. ....................... | 437/43 |
| 5,750,416 | 5/1998 | Hshieh et al. ............................ | 438/286 |
| 5,783,474 | 7/1998 | Ajit ........................................... | 438/279 |
| 5,854,099 | 12/1998 | Farrenkopf ............................... | 438/201 |
| 5,981,343 | 11/1999 | Magri et al. .............................. | 438/268 |

OTHER PUBLICATIONS

H. J. Gregory, et al., "A 0.72μm Smart Power Technology using Non–Self–Aligned DMOS and Up/down–diffused HV Wells" (4 pages).

*Primary Examiner*—John F. Niebling
*Assistant Examiner*—John Murphy
*Attorney, Agent, or Firm*—Limbach & Limbach L.L.P.

[57] ABSTRACT

A DMOS structure is formed with P-body and N-source implantations are self-aligned using the same photoresist mask. Following formation of field isolation structures and removal of the composite nitride, a 'double-implantation' of P body and N source is made using a single resist masking stage. This process flow utilizes a relatively low N-source implantation dose, as N-source and P-body implantations are subsequently thermally diffused together (co-driven) using the original thermal budget of the P-body drive-in. The N-source implant thus now sees the same thermal budget as does the P-body implant. As a result in this process scheme, overetching of P-body and N-source during composite nitride removal is eliminated, while process simplicity is conserved. Moreover, channel overlap remains self-aligned by implanting N-source and P-body through the same mask. Differing rates of thermal diffusion of the P and N type dopant determine the extent of channel overlap.

5 Claims, 14 Drawing Sheets

6,069,034

DMOS ARCHITECTURE USING LOW N-SOURCE DOSE CO-DRIVEN WITH P-BODY IMPLANT COMPATIBLE WITH E²PROM CORE PROCESS

CROSS-REFERENCE TO RELATED APPLICATION

The subject matter of this application is related to pending U.S. patent application Ser. No. 08/870,920, filed Jun. 6, 1997, entitled "DMOS PROCESS MODULE APPLICABLE TO AN E² CMOS CORE PROCESS," inventor Douglas R. Farrenkopf. The text of this related application is hereby incorporated by reference.

BACKGROUND OF THE INVENTION

1. Field of the Invention

The present invention relates to the fabrication of integrated circuit devices and, in particular, to a process module that produces DMOS devices with highly controllable parameters and allows DMOS transistors to be incorporated into a CMOS-based fabrication process flow without disturbing existing CMOS/E²PROM devices.

2. Discussion of The Related Art

Two distinct types of DMOS structures are known: vertical DMOS (VDMOS), and lateral DMOS (LDMOS). FIGS. 1A and 1B show cross-sectional views of VDMOS and LDMOS devices 100 and 100' respectively.

Both VDMOS structure 100 and LDMOS structure 100' include a P type body region 116 formed within an N type tub 106. N type source region 118 is formed within P type body 116.

An N type drain region is formed within the surrounding silicon. In the case of VDMOS structure 100, the drain takes the form of buried N+ layer 102 which is in electrical communication with sinker region 108 having sinker contact 108a. In the case of LDMOS structure 100', the drain takes the form of the surrounding N tub 106 having contact region 107.

Channel 105 lies between the source and drain. Gate 112 overlies channel 105 and is separated from the channel by gate oxide 110.

DMOS devices 100 and 100' are electrically isolated from surrounding structures by adjacent P type well 150, buried P layer 152, and field oxide 104.

DMOS transistors require the N-source to be self-aligned to the P-body implant in order to yield good threshold voltage ($V_t$) and "on" drain-source resistance ($R_{ds\_on}$) control characteristics. This is typically accomplished by 1) implanting the P-body after the DMOS polysilicon has been defined, 2) driving-in the P-body implant with a large thermal budget that produces a large diffusion length ($\sqrt{Dt}$), and then 3) implanting the N-source. The DMOS channel length ($L_D$) is defined as the length of lateral extension of the P-body region under the polysilicon gate. A conventional process flow for fabricating a VDMOS structure is illustrated in greater detail in FIGS. 2A–2D.

FIG. 2A shows a precursor VDMOS structure 101 created within epitaxial silicon 103 grown over P-silicon substrate 156. Precursor VDMOS structure 101 includes N⁺ buried layer 102 formed by implantation into substrate 156 followed by growth of epitaxial layer 103. N-tub region 106 and N-sinker region 108 are then defined using N-tub and N-sinker masks, respectively. Field oxide isolation regions 104 are defined with an additional field oxide region 104' providing isolation for the N⁺ sinker region 108. A layer of gate oxide 110 separates the polysilicon gate regions 112 from the N-tub 106.

FIG. 2B shows the formation of a photoresist mask 114 over selected portions of precursor VDMOS structure 101. Resist mask 114 is used to facilitate a boron implant for initial introduction of P-type dopant for the P-body region.

FIG. 2C shows the P-body region 116 of the VDMOS device following thermal drive-in. FIG. 1D shows the final VDMOS device structure after a mask and ion implant step to define N-source regions 118.

The channel length of the VDMOS device shown in FIG. 2D is designated as $L_D$. In this DMOS design, channel length $L_D$ is not affected by mask misalignments or etch biases. This is because both the P-body implant and the N-source implant are self-aligned to polysilicon gates that have already been formed.

Recent circuit applications require DMOS structures to be fabricated on the same chip as E²PROM devices. Cross-sectional views of a conventional E²PROM structure are shown in FIGS. 3A and 3B.

It is desirable to use the same polysilicon layer for both the E²PROM floating gate and for the DMOS polysilicon gate. However, in processes utilized to manufacture the E²PROM structure shown in FIGS. 3A–3B, the thermal budget cannot be too high following deposition of the floating polysilicon gate or else the double diffused drain (DDD) and high voltage threshold voltage ($HV_t$) implants, created prior to deposition of the floating polysilicon, will be adversely affected.

Specifically, application of too high a thermal budget will disturb the DDD and the tunnel oxide will be degraded. That is, if a large thermal budget is run after formation of the floating gate polysilicon structure, then the DDD implant will diffuse too deeply beyond the typically desired 0.4 $\mu$m depth. In such a process flow, $HV_t$ implant would also diffuse deeper, changing the threshold voltage of the device. Thus, the presence of an E²PROM structure requires that the thermal budget be kept relatively low once the floating polysilicon gate has been deposited.

However, as described in connection with FIG. 2C above, the conventional DMOS process flow requires that heat cycles be sufficiently high following deposition of the polysilicon gate in order to drive the P-body implant approximately one micron laterally.

One solution to this incongruity between E²PROM and DMOS process flow requirements is to utilize separate polysilicon layers for the gate of the DMOS and for the floating gate of the E²PROM. However, this approach increases the number of processing steps, and thus increases wafer cost and defect density.

Moreover, utilizing separate polysilicon layers can introduce a "poly stringer" problem into the process. This "poly stringer" problem is a result of the second polysilicon deposition occurring over the sharp steps of the masked and defined first polysilicon layer. Such a structure is difficult to etch without leaving second polysilicon filaments.

Another solution to the problem is proposed in pending U.S. patent application Ser. No. 08/870,970, filed Jun. 6, 1997, entitled "DMOS PROCESS MODULE APPLICABLE TO AN E² CMOS CORE PROCESS," inventor Douglas R. Farrenkopf (hereafter "the Farrenkopf Application"). The Farrenkopf Application describes a process module in which the P-body implant and the N-source implant of a DMOS device are self-aligned by employing the composite nitride layer which has already been used to form field isolation structures.

FIGS. 4A–4J illustrate cross-sectional views of a process flow for fabricating a DMOS transistor structure in an E²PROM process flow in accordance with the Farrenkopf Application.

FIG. 4A shows precursor VDMOS structure 201, which is the starting point for the Farrenkopf process. Precursor VDMOS structure 201 is formed in a conventional manner within epitaxial silicon 203 grown over silicon substrate 256. Precursor VDMOS structure 201 includes an N-type tub 204 formed over an N+ buried region 202. N-type tub 204 includes an N+ sinker region 208. N+ sinker region 208 is formed at an edge of N-type tub 204 and extends from a surface of the N-type tub to the N+ buried region 202.

Referring now to FIG. 4B, a composite pad oxide 212 and nitride 214 deposition is performed upon precursor VDMOS structure 201, followed by definition of a composite mask and etching of the composite nitride layer to identify field oxide regions. A P-field mask and implant and is then performed to increase the P-well field threshold voltage. Field oxide isolation regions 216 are then grown in the conventional manner, resulting in the structure shown in FIG. 4B.

Next, as shown in FIG. 4C, a layer of resist 218 is formed and the nitride 214 is etched using this P-body mask 218, enabling a subsequent implant of P-type dopant to form a P-body region 220 in the N-tub 204.

Following removal of the P-body mask 218, another layer of resist 222 is formed and patterned to enable another P-type implant to form a deep P+ region 224 within the P-body 220, resulting in the structure shown in FIG. 4D.

In FIG. 4E, the deep P+ resist mask 222 is then stripped and a P-body thermal drive-in step is performed. The application of thermal energy results in the additional growth of oxide during this step. Approximately 400 Å of oxide 212 remains over the P-body region 220, so that silicon is not reached during the subsequent stripping of the composite nitride 214 as shown in FIG. 4G strip step.

In FIG. 4F, ion implant of N-type dopant is then performed, resulting in formation of an N-source region 226 in P-body 220. Nitride layer 214 should be thick enough to block the N-source implant at the periphery of the P-body region 220, but if it isn't, an additional nitride deposition step could be inserted before the P-body mask step described above.

In FIG. 4G, following a nitride strip and pad oxide strip, a layer of sacrificial oxide is grown. Then, a threshold voltage $V_T$ adjust mask is defined to cover the VDMOS region with resist. A $V_T$ implant is then performed to set the threshold voltages of the MOS devices to an appropriate level. The sacrificial oxide is then stripped.

A screen oxide layer is then grown, and a buried N+ mask is formed, followed by a buried N+ implant. The screen oxide is then stripped and a cell gate oxide layer is formed. Next, a tunnel oxide mask is patterned, tunnel oxide windows are etched in the gate oxide and tunnel oxide is grown in the windows. A layer of polysilicon is then deposited and doped to a desired conductivity level. A layer of oxide/nitride/oxide (ONO) is then formed on the polysilicon layer.

The polysilicon layer is then masked and etched to define the polysilicon gate regions 230 of the VDMOS transistor. Simultaneously, the polysilicon floating gates of the E²PROM devices are also being created. The resulting VDMOS structure is shown in FIG. 4H.

Referring to FIG. 4H, a threshold voltage implant for the low voltage devices is then performed, E²PROM control gates are masked and implanted and a second gate oxide layer is grown. Next, the second layer of polysilicon for the E²PROM is deposited, doped, masked and etched and a polyseal oxide is formed. Next, for the E²PROM, the PLDD mask and implant and NLDD mask and implant steps are performed. Then, a spacer oxide is deposited and etched back to form oxide sidewall spacers 232 on the DMOS gate regions, as shown in FIG. 4I.

Then, an N+ mask is formed and N-type dopant is implanted into the VDMOS structure, forming N+ contacts 234 of N source regions 226, and also concentrated sinker contact 208a. Following a poly oxide step, a P+ mask is formed and P type dopant is implanted to form P+ region 235 separating N+ contact regions 234, as shown in FIG. 4J.

Fabrication of the VDMOS structure is completed with back-end processing, wherein a layer of dielectric material is formed, masked and etched to form contact openings to the VDMOS N source contact regions and the N+ sinker region. This is followed by deposition, masking and etching of a first metal layer to form contacts to the N source contact and N+ sinker regions. Contacts and metal are also connected to the gate structure.

One important result of the approach proposed by the Farrenkopf Application is that the channel length $L_D$ of the DMOS device is self-aligned to the composite nitride, and is not dependent upon masking alignments or etch biases.

There are two important reasons why the channel length $L_D$ must be well controlled. First, in a DMOS transistor, the threshold voltage is determined by the P-body concentration in the proximity of the N⁻ source. If there is misalignment between the source and the P-body, even on the order of 0.1 μm, this will result in large threshold voltage variations. Second, $R_{ds\_on}$ is affected by channel length $L_D$; therefore, variations in channel length $L_D$ result in unwanted and unpredictable changes in $Rd_{ds\_on}$.

It is important to note that while the channel length $L_D$ of the DMOS device is self-aligned, the same cannot be said for the length of the gate overlap of the source ($L_S$). This is because the position of polysilicon gate relative to the source is determined by masking steps.

Fortunately, precise control of $L_S$ is not critical to a DMOS transistor. This is because the $L_S$ would affect the DMOS transistor negatively only if it became so long as to significantly increase the source resistance. However, in the process flow proposed by Farrenkopf the gate/source overlap $L_S$ only increases source resistance to the extent that total $Rd_{ds\_on}$ increased by less than one percent, which is insignificant.

While the process proposed by the Farrenkopf Application provides for significant improvement over the prior art, it does have one drawback. It has proven relatively difficult to remove composite nitride layer 214 relative to the underlying pad oxide as called for in FIG. 4G. The aggressive nature of the composite nitride strip after the N-source implantation leads to large oxide overetch, despite the presence of the additional ≈400 Å of oxide grown resulting from the P-body drive-in step of FIG. 4E. Because of overetching during removal of composite nitride, the silicon surface is unprotected and trenches form in the silicon of the P-body and N-source during the nitride strip. The resulting loss in dopant at the P-body and N-source is detrimental to device behavior and, thus, to process control.

Therefore, it is desirable to utilize a process flow wherein the composite nitride layer is removed prior to performance of the P-body and N-source implants, while retaining the self-aligned channel overlap and overall process simplicity of the Farrenkopf process.

SUMMARY OF THE INVENTION

The present invention provides a process module in which once field oxide has been formed and composite nitride removed, P-body and N-source implantations for a DMOS device are self-aligned using the same photoresist mask. Stated another way, a 'double-implantation' is made using one resist masking stage. This process flow utilizes a relatively low N-source implantation dose because the N-source and P-body implantations are subsequently thermally diffused together (co-driven) using the original diffusion cycle. Thus, the N-source implant now sees the same thermal budget as does the P-body implant.

As a result in this alteration in the process scheme, overetching of the P-body and N-source is eliminated while process simplicity is conserved. Moreover, self-alignment of the channel overlap is preserved by the differing rates of thermal diffusion of the P and N type dopant of the co-implanted body and source respectively.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

The present invention will now be described in conjunction with FIGS. 5A–5J, which show partial cross-sectional views of the process steps in accordance with a first embodiment of the present invention.

Figure 1A:
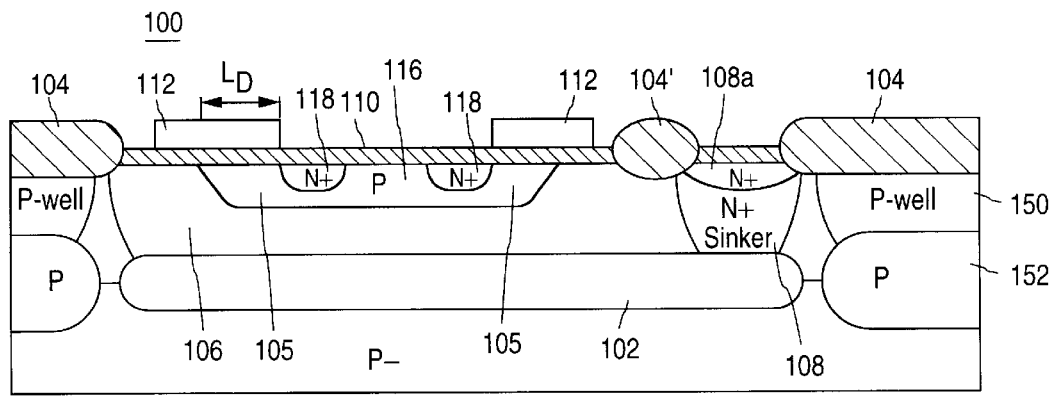
FIGS. 1A–1B are partial cross-sectional drawings illustrating a conventional VDMOS and LDMOS structure.
Figure 1B:
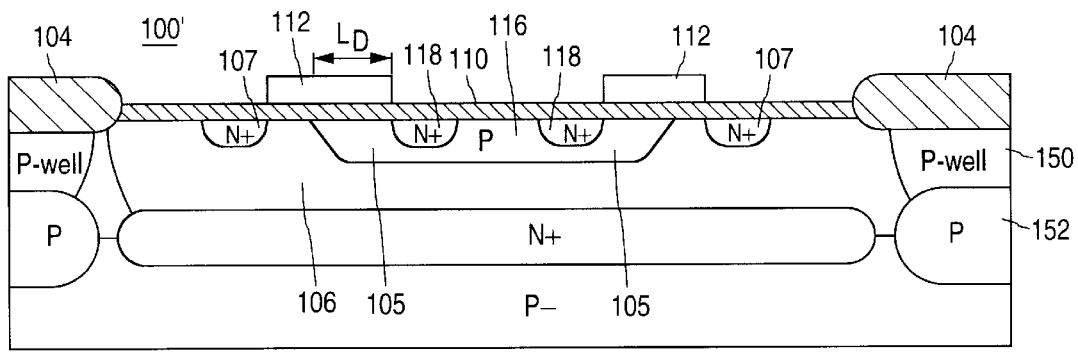
Figure 2A:
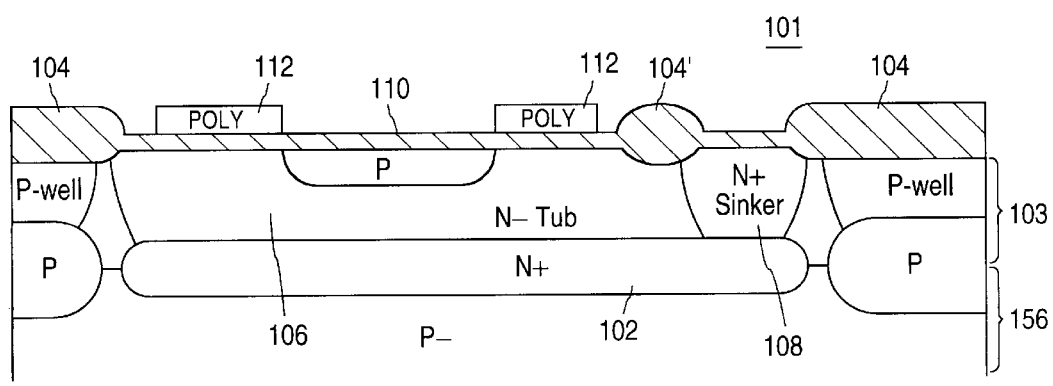
FIGS. 2A–2D are partial cross-sectional drawings showing the conventional process for forming the VDMOS structure shown in FIG. 1A.
Figure 2B:
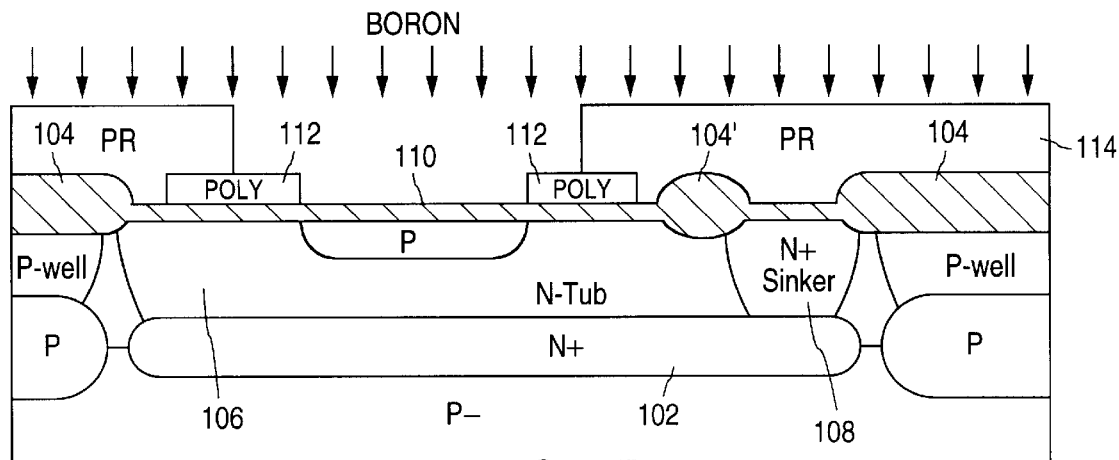
Figure 2C:
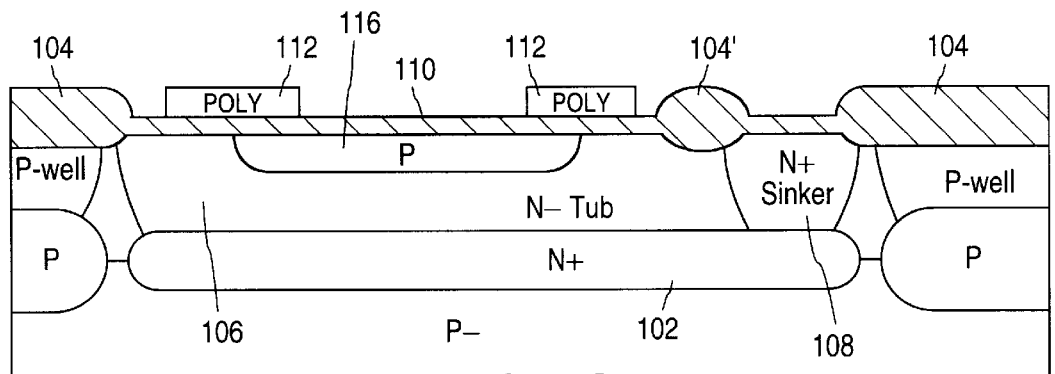
Figure 2D:
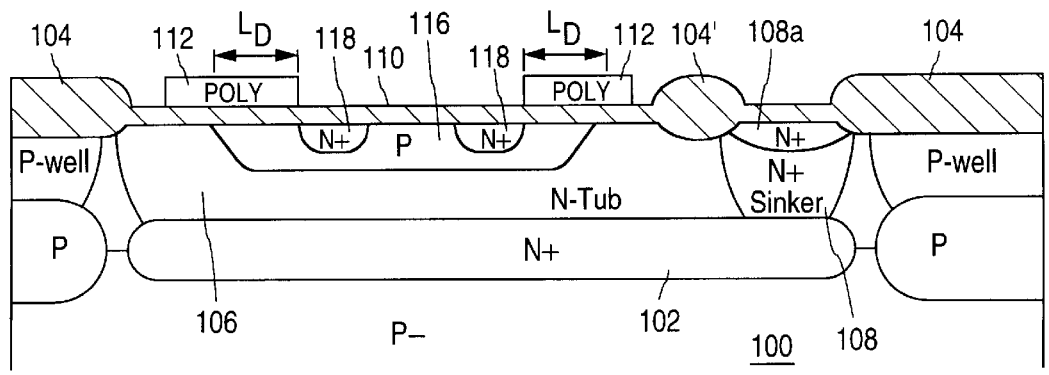
Figure 3A:
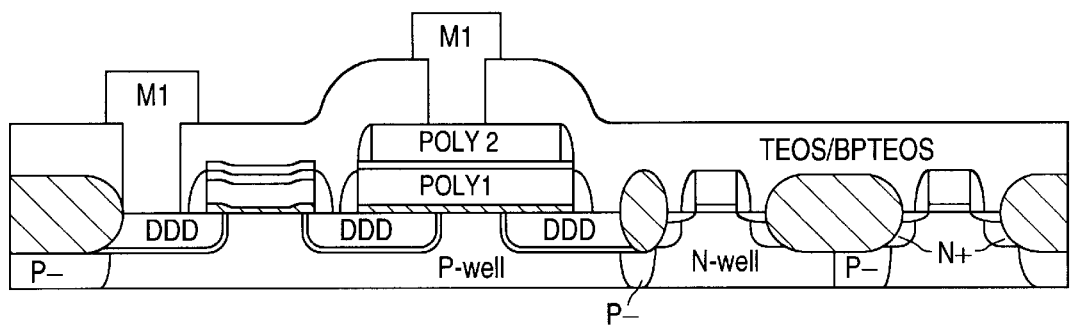
FIGS. 3A–3B are partial cross-sectional drawings illustrating a conventional E²PROM structure.
Figure 3B:
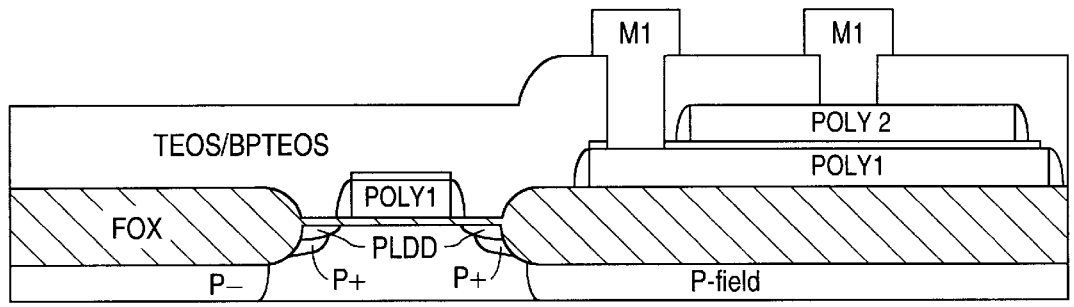
Figure 4A:
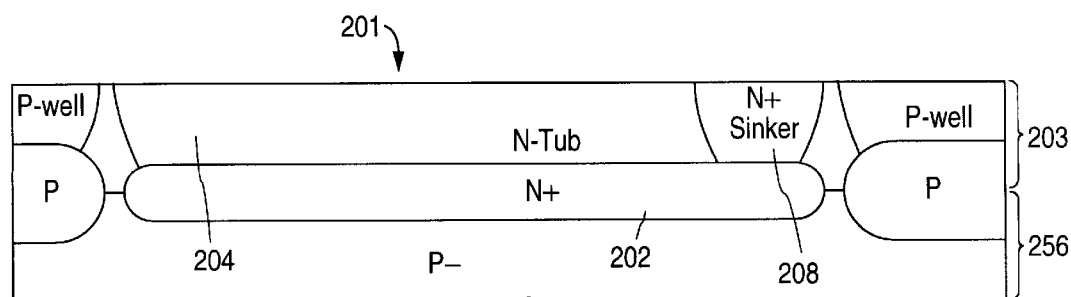
FIGS. 4A–4J are partial cross-sectional drawings illustrating a process flow for fabricating a DMOS structure in accordance with the Farrenkopf Application.
Figure 4B:
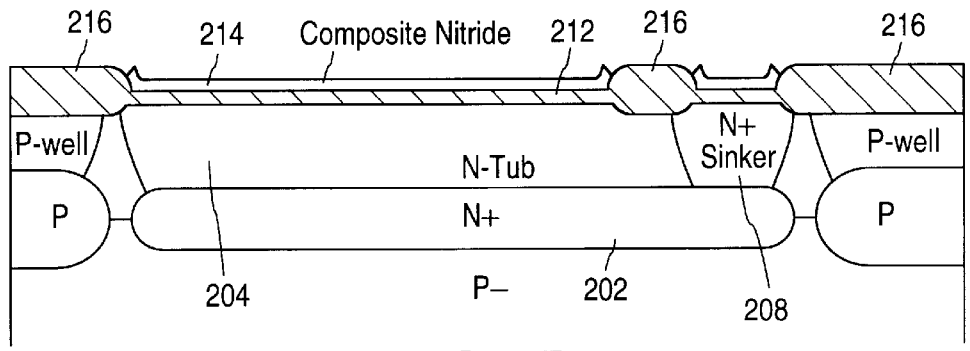
Figure 4C:
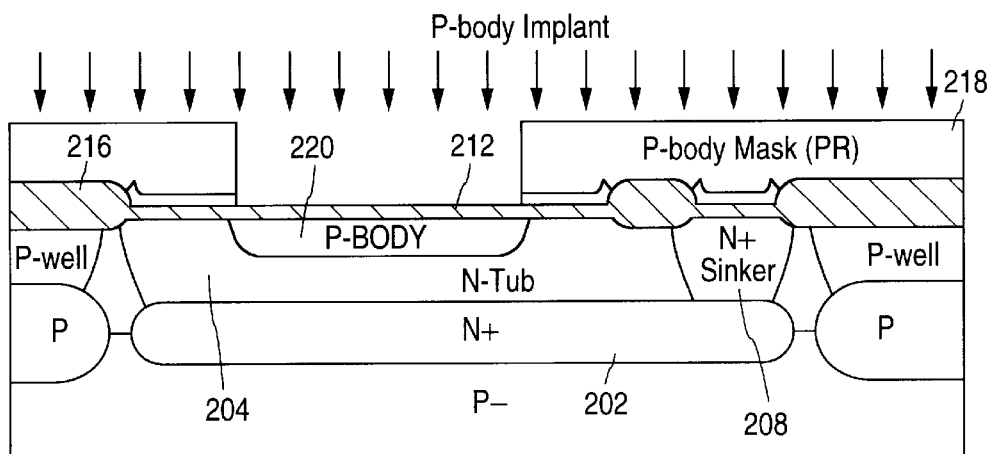
Figure 4D:
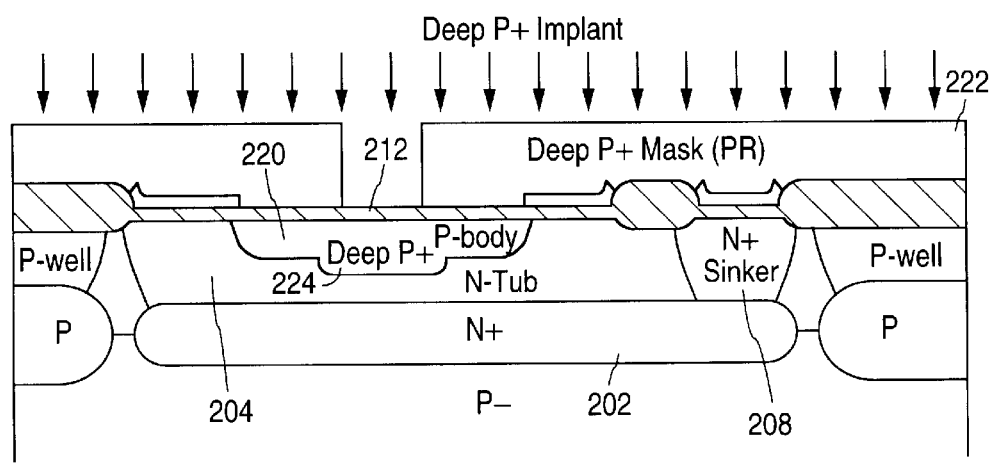
Figure 4E:
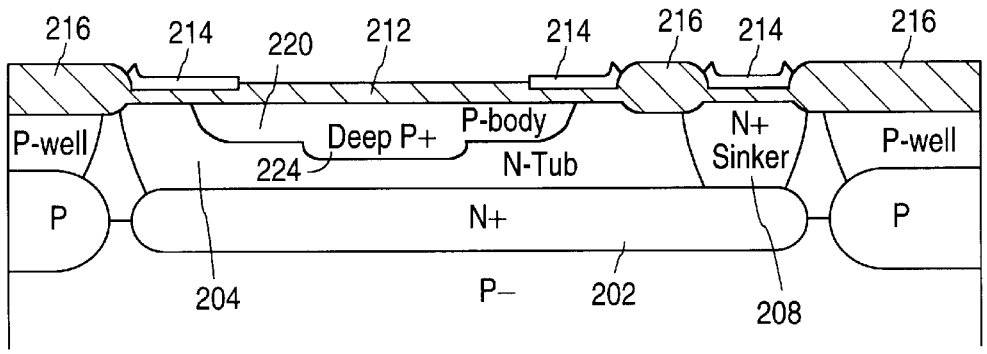
Figure 4F:
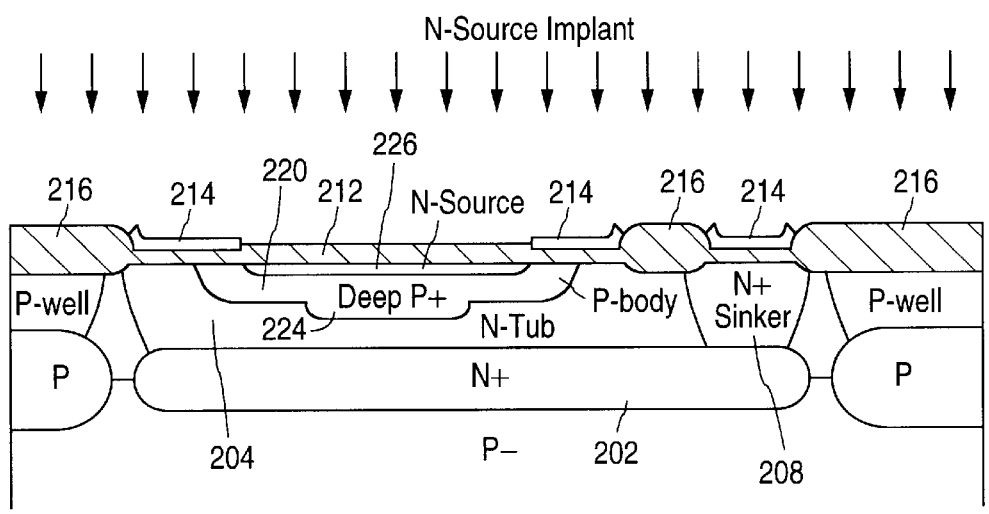
Figure 4G:
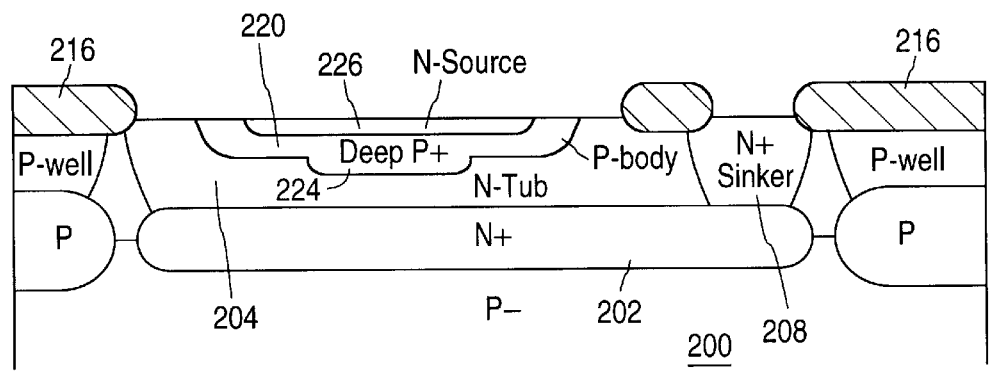
Figure 4H:
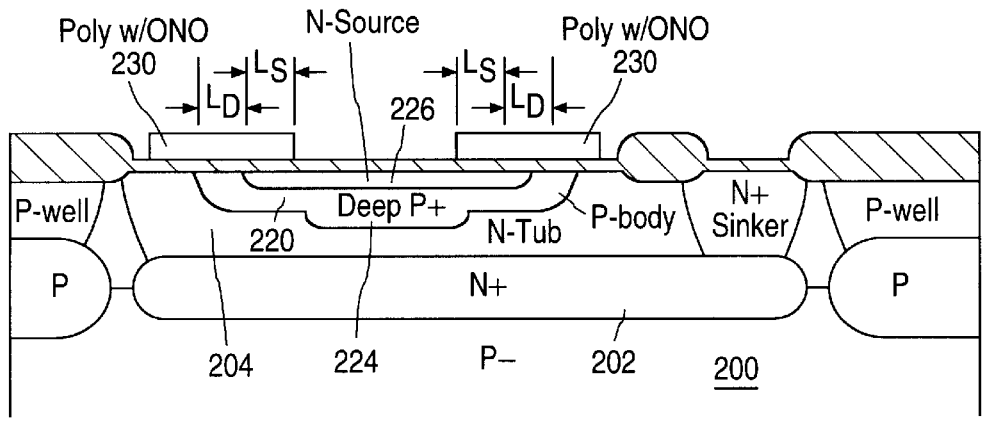
Figure 4I:
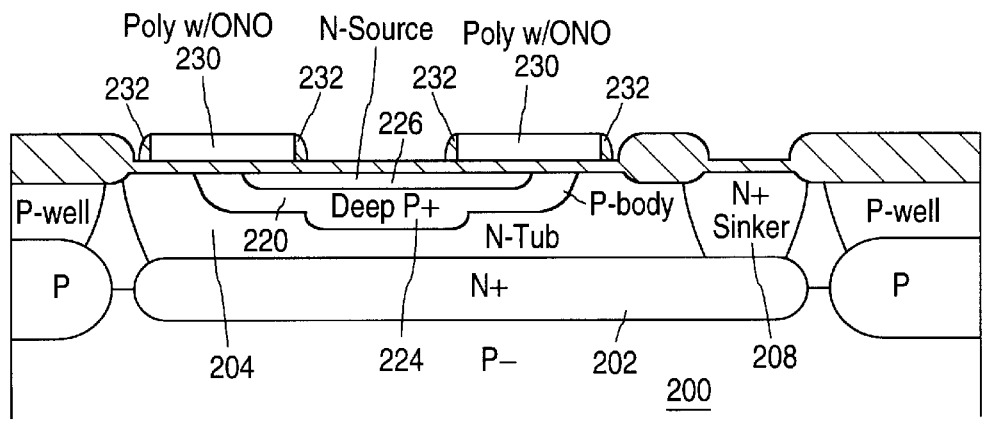
Figure 4J:
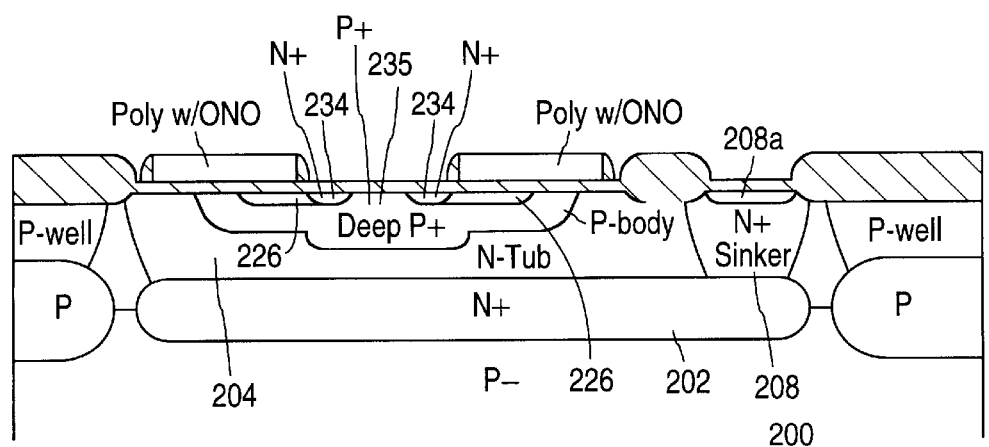
Figure 5A:
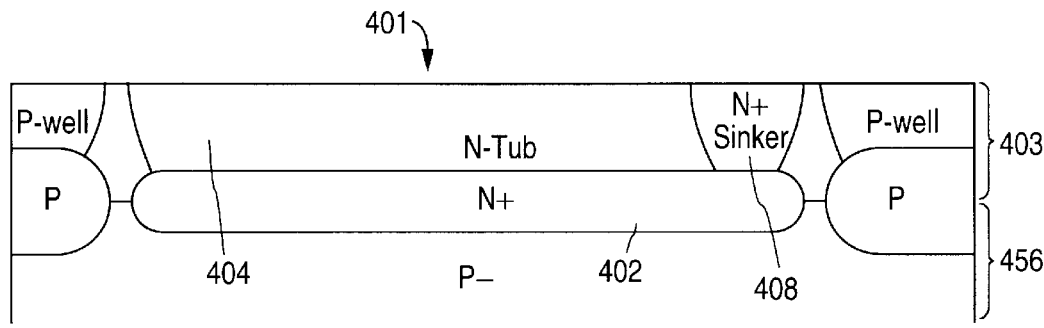
FIGS. 5A–5J are partial cross-sectional drawings illustrating a process flow for fabricating a DMOS structure in accordance with a first embodiment of the present invention.

FIG. 5A shows precursor VDMOS structure 401, which is the starting point for the process of the present invention. As described above in connection with FIG. 3A, precursor VDMOS structure 401 is formed in a conventional manner within epitaxial silicon 403 grown over silicon substrate 456. Precursor VDMOS structure 401 includes an N-type tub 404 formed over an N+ buried region 402. N-type tub 404 includes an N+ sinker region 408. N+ sinker region 408 is formed at an edge of N-type tub 404 and extends from a surface of the N-type tub to the N+ buried region 402.

Figure 5B:
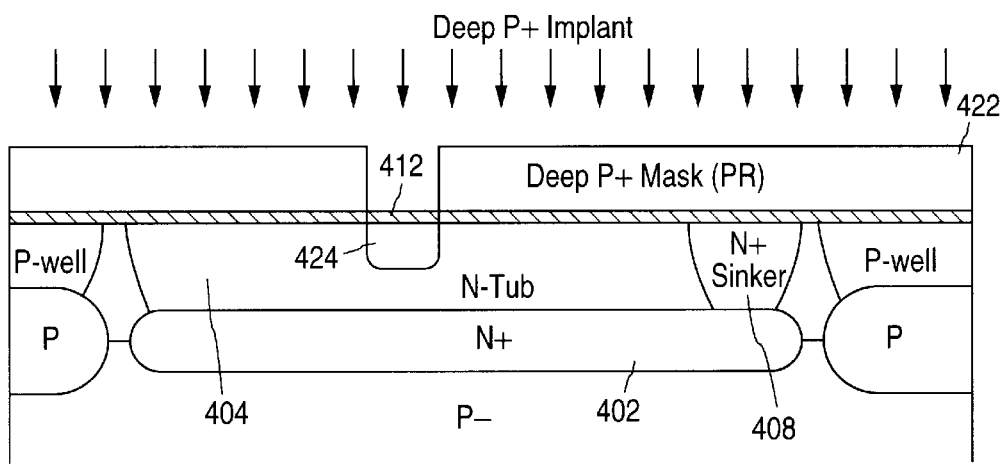

As shown in FIG. 5B, once pad oxide 412 is formed, deep P+ resist layer 422 is formed and patterned to enable P-type implant to create deep P+ region 424 within the N-tub 404. This results in the structure shown in FIG. 5B.

Figure 5C:
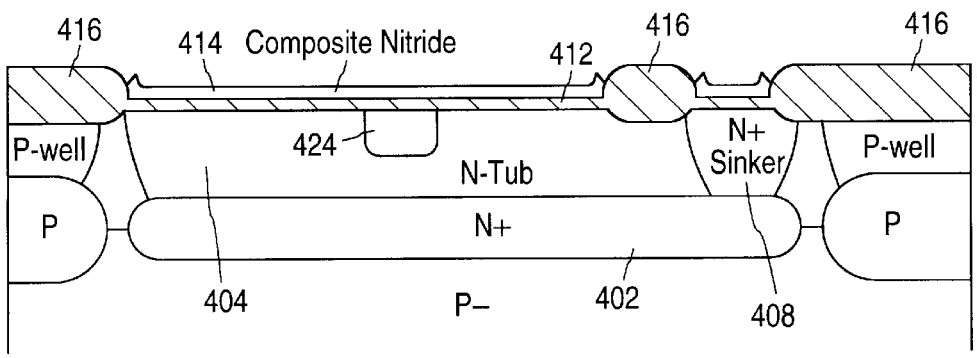

FIG. 5C illustrates that following removal of deep P+ resist mask 422, a composite pad oxide and nitride 414 deposition is performed, followed by formation of a composite mask and etching of the composite nitride layer to identify field oxide regions. A P-field mask and implant and is then performed to increase the P-well field threshold voltage. Field oxide isolation regions 416 are then grown in the conventional manner, resulting in the structure showing in FIG. 5C. The heating required to grow field oxides 416 also helps to anneal damage from the deep P+ implant of the prior step.

Figure 5D:
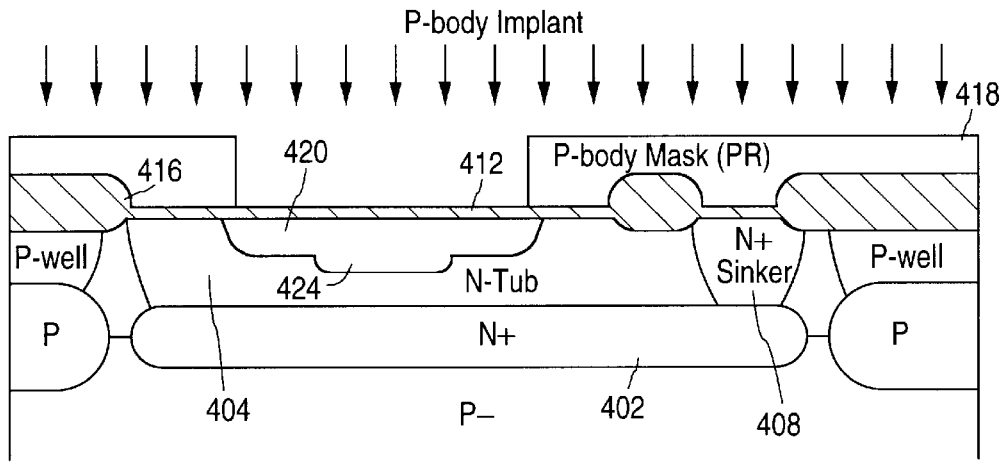

Next, as shown in FIG. 5D, composite nitride layer 414 is then stripped utilizing a chemistry selective to oxide. A layer of resist is then defined using the P-body mask 418, enabling a subsequent implant of P-type dopant to form a P-body region 420 contiguous with existing deep P+ region 424 in the N-tub 404.

Figure 5E:
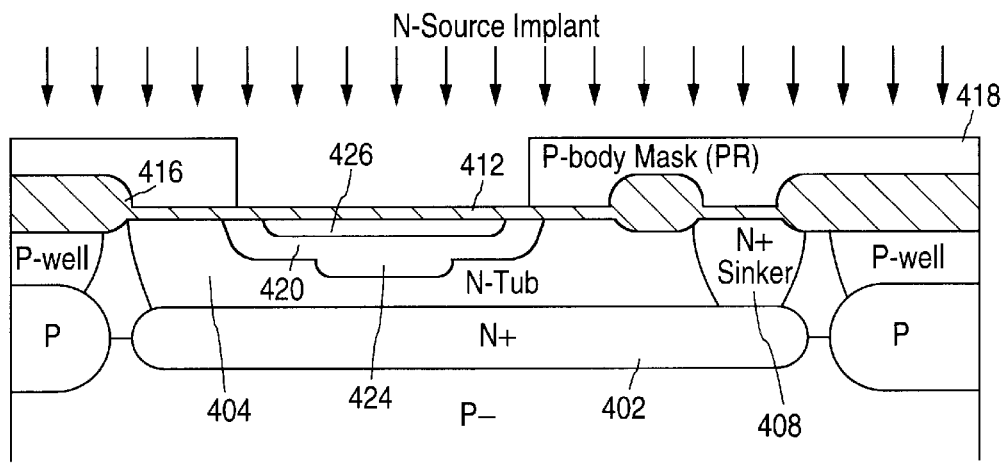
Figure 5F:
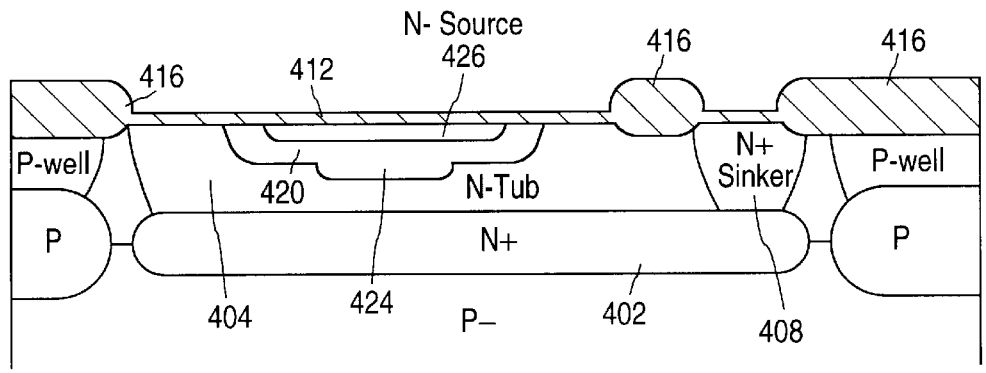
Figure 5G:
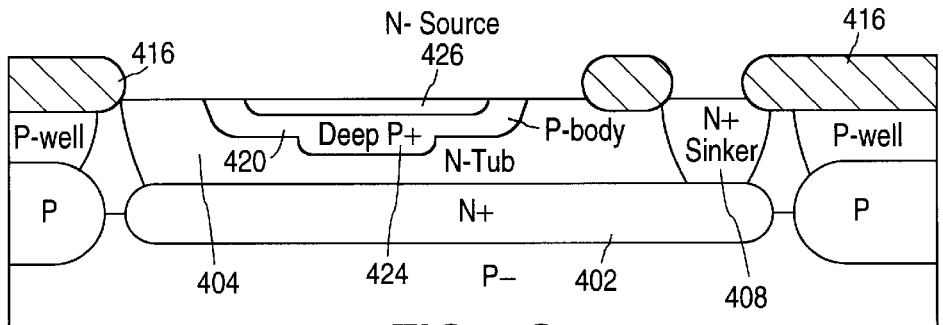

Then, as shown in FIG. 5E, immediately following implantation of P-type dopant to form the P-body region, N-type dopant is implanted utilizing the identical P-body mask 418, to create an N-source region 426 coextensive with P-body region 420.

The P-body mask 418 is then stripped and a heat drive-in step is performed upon P-body 420, deep P+ region 424, and N-source implant 426. The resulting structure is shown as FIG. 5F.

N-type dopant present in the N-source region 426 is now exposed to the larger thermal budget associated with the conventional P body drive in, and thus diffuses much deeper vertically and laterally than in the Farrenkopf process. This results in a smaller channel width $L_D$ and a larger P-body sheet resistance under the N-source region 426. To overcome this disadvantage, the dose of the N-source implant must be reduced. The N-source dose must be low enough to ensure low drain/source leakage, and high enough to give sufficiently low $V_T$. It has been found that in order to obtain the same device characteristics as produced by the Farrenkopf Application, the dose of the N-source implant must be substantially reduced, as described in detail later in conjunction with FIG. 9.

Following the thermal drive-in step, the sacrificial oxide layer 412 is stripped and then regrown. Next, a threshold voltage $V_T$ adjust mask is defined to cover the VDMOS region with resist. A $V_T$ implant is then performed to set the threshold voltages of the E²MOS devices to an appropriate level. The sacrificial oxide 412 is then stripped, producing the structure shown in FIG. 5G.

A screen oxide layer is then grown, and a buried N+ mask is formed, followed by a buried N+ implant. The screen oxide is then stripped and a cell gate oxide layer is formed.

Next, a tunnel oxide mask is patterned, tunnel oxide windows are etched in the gate oxide and tunnel oxide is grown in the windows. A layer of polysilicon is then deposited and doped to a desired conductivity level. A layer of oxide/nitride/oxide (ONO) is then formed on the polysilicon layer.

The polysilicon layer is then masked and etched to define the polysilicon gate regions 430 of the DMOS transistor, and, simultaneously, the polysilicon floating gates of the E²PROM transistors. The resulting DMOS structure is shown in FIG. 5H.

Figure 5H:
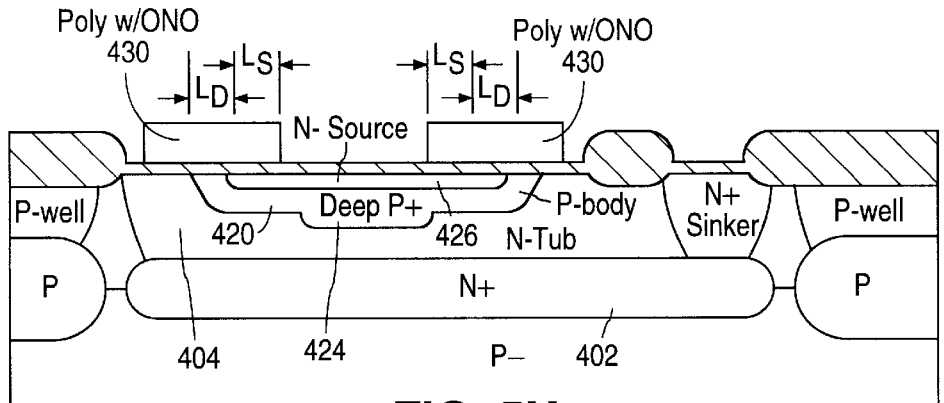
Figure 5I:
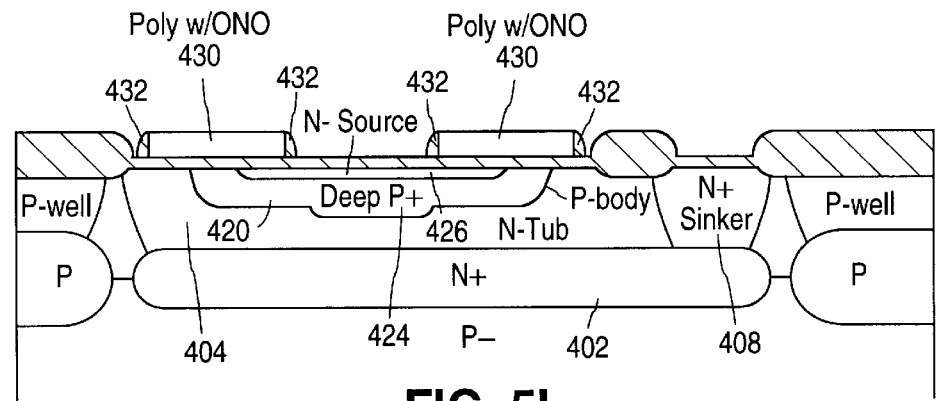

Referring to FIG. 5H, a threshold voltage implant for the low voltage devices is then performed, E²PROM control gates are masked and implanted and a second gate oxide layer is grown. Next, the second layer of polysilicon for the E²PROM is deposited, doped, masked and etched and a polyseal oxide is formed. Next, for the E²PROM, the PLDD mask and implant and NLDD mask and implant steps are performed. A spacer oxide is then deposited and etched back to form oxide sidewall spacers 432 on the DMOS gate regions, as shown in FIG. 5I.

Figure 5J:
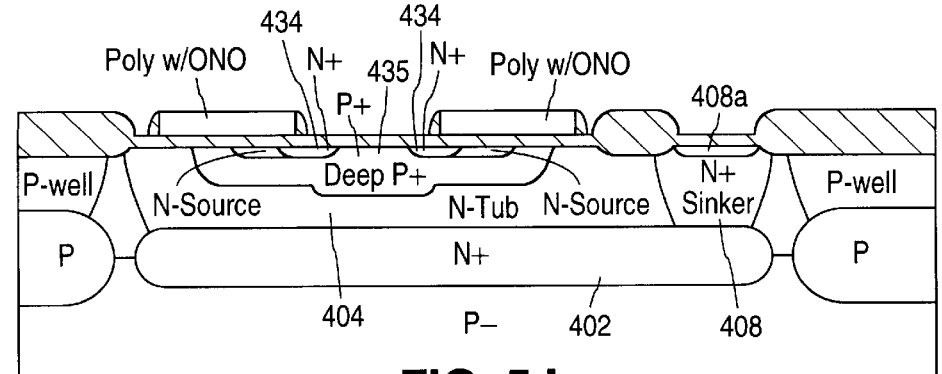

Next, an N+ mask is formed and N-type dopant is implanted into the DMOS structures, forming N+ contacts 434 of source regions 431 adjacent to gates 430. Sinker contact region 408a are also formed by this implant. Following a poly oxide step, a P+ mask is formed and P type dopant is implanted to create P+ region 433 separating N+ contact regions 434, as shown in FIG. 5J.

Fabrication of the VDMOS structure is completed with back-end processing, wherein a layer of dielectric material is formed, masked and etched to form contact openings to the VDMOS N source contact regions and the N+ sinker contact region. This is followed by deposition, masking and etching of a first metal layer to form contacts to the N source contact and N+ sinker regions contact. Contacts and metal are also connected to the gate structure.

The favorable performance characteristics of DMOS transistors fabricated in accordance with the present invention are revealed by both experiment and modelling. Processing was modelled utilizing version 6.5 of the SUPREM software package, and device performance was modelled utilizing version 4.0 of the Medici software program, both run on a Sun Ultrasparc workstation. Both SUPREM and Medici are produced by Avanti! Corporation of Fremont, Calif.

Figure 6:
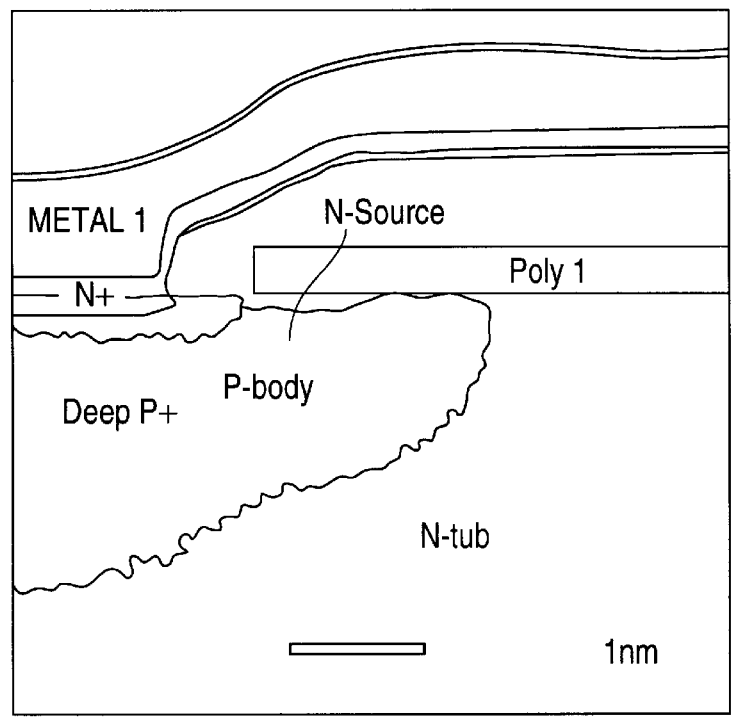
FIG. 6 gives a SEM cross-section through the gate/source/body of a DMOS formed in accordance with the present invention.
Figure 7:
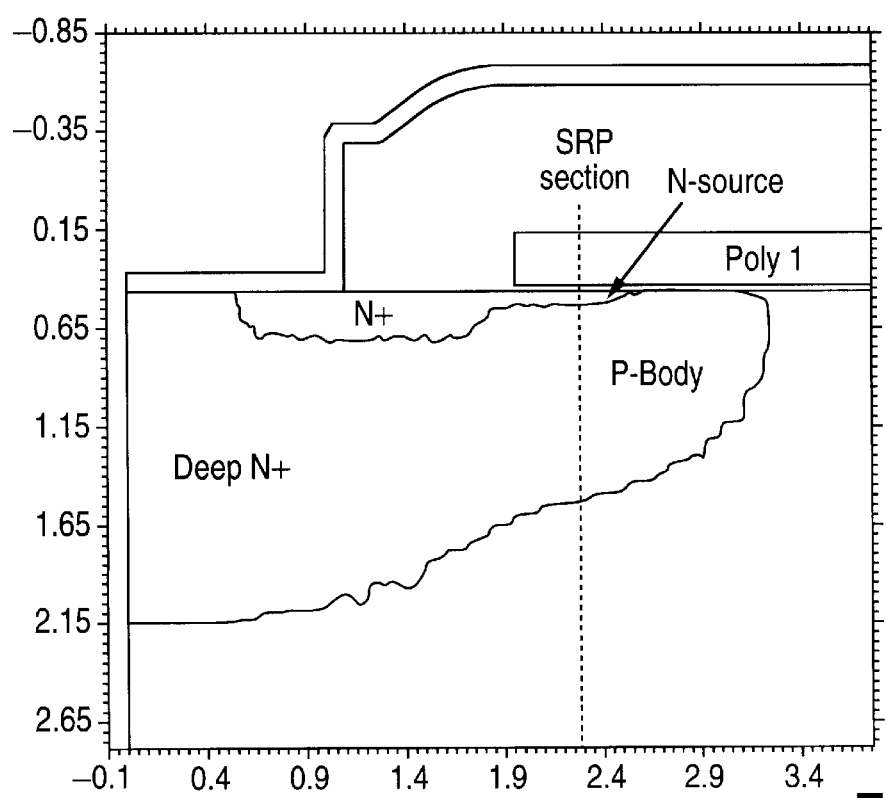
FIG. 7 shows a simulated cross-section through the gate/source/body of a DMOS formed in accordance with the present invention.
Figure 8:
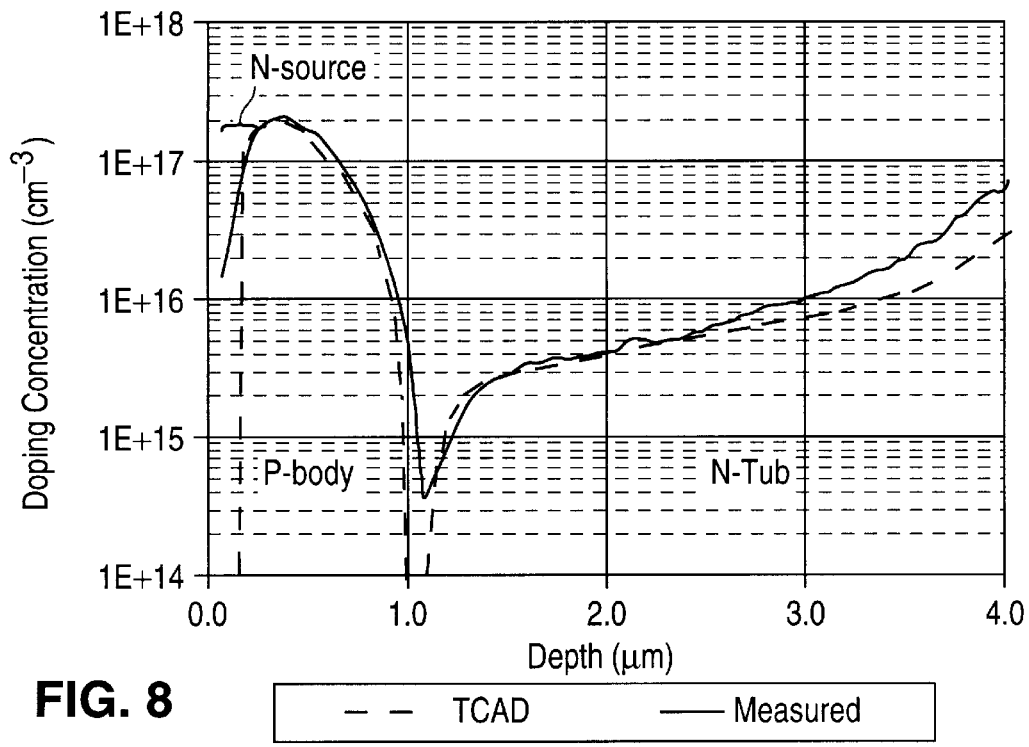
FIG. 8 plots predicted and measured spreading resistance profile dopant concentrations versus depth into the substrate for a DMOS formed in accordance with the present invention.

FIGS. 6–8 give experimental and modelling data for a DMOS structure formed in accordance with the present invention. This DMOS structure was formed under the conditions given in TABLE 1 below:

TABLE 1

| FABRICATION PARAMETER | VALUE |
|---|---|
| Thickness of Epi | 7 $\mu$m |
| N-tub implant dose | $7 \times 10^{11}$ ions/cm² |
| Deep P+ implant dose | $2 \times 10^{14}$ ions/cm² |
| Deep P+ implant energy | 30 KeV |
| P-body implant dose | $2.2 \times 10^{13}$ ions/cm² |
| P-body implant energy | 50 KeV |
| N-source implant dose | $3.5 \times 10^{12}$ ions/cm² |
| N-source implant energy | 60 KeV |
| Drive-in temp | 1100° C. |
| Drive-in duration | 25 min |

FIG. 6 gives a SEM cross-section through the gate/source/body of the DMOS described above. FIG. 6 shows an extension of the P-body region under the gate of about 1.5 $\mu$m, and a corresponding extension of the N-source under the gate of about 0.7 $\mu$m.

FIG. 7 shows a simulated cross-section through the gate/source/body of the DMOS described above. FIG. 7 demonstrates the close correspondence of the structure observed in FIG. 6 with that simulated.

FIG. 8 plots predicted and measured dopant concentration versus depth into the substrate for the DMOS described above. FIG. 8 shows good agreement between the measured spreading resistance profile (SRP) and the simulation SRP. The N-source is a shallow compensated region (≈0.25 $\mu$m deep) in the P-body (≈1.0 $\mu$m deep), with peak doping of about $2 \times 10^{17}$ atoms/cm³. This P-body architecture has proven to be reproducible, with insignificant variations in the SRP and SEM as well as in the resulting measured electrical performance of the DMOS device.

Although the invention has been described in connection with one specific preferred embodiment, it should be understood that the invention as claimed should not be unduly limited to such specific embodiments. Various other modifications and alterations in the structure and method of operation of this invention will be apparent to those skilled in the art without departing from the scope of the present invention.

For example, while the first embodiment of the present invention is described as utilizing a composite nitride layer in conjunction with LOCOS field oxide regions, field oxide regions could be formed using alternate methods such as shallow trench isolation.

Moreover, while the specific process parameters of TABLE 1 leading to formation of the DMOS structure shown in FIGS. 6, 7, and 8 are provided, those skilled in the art will appreciate that the concepts of the invention are applicable under a spectrum of possible parameters, which will vary depending upon the particular application for the DMOS device to be manufactured.

Figure 9:
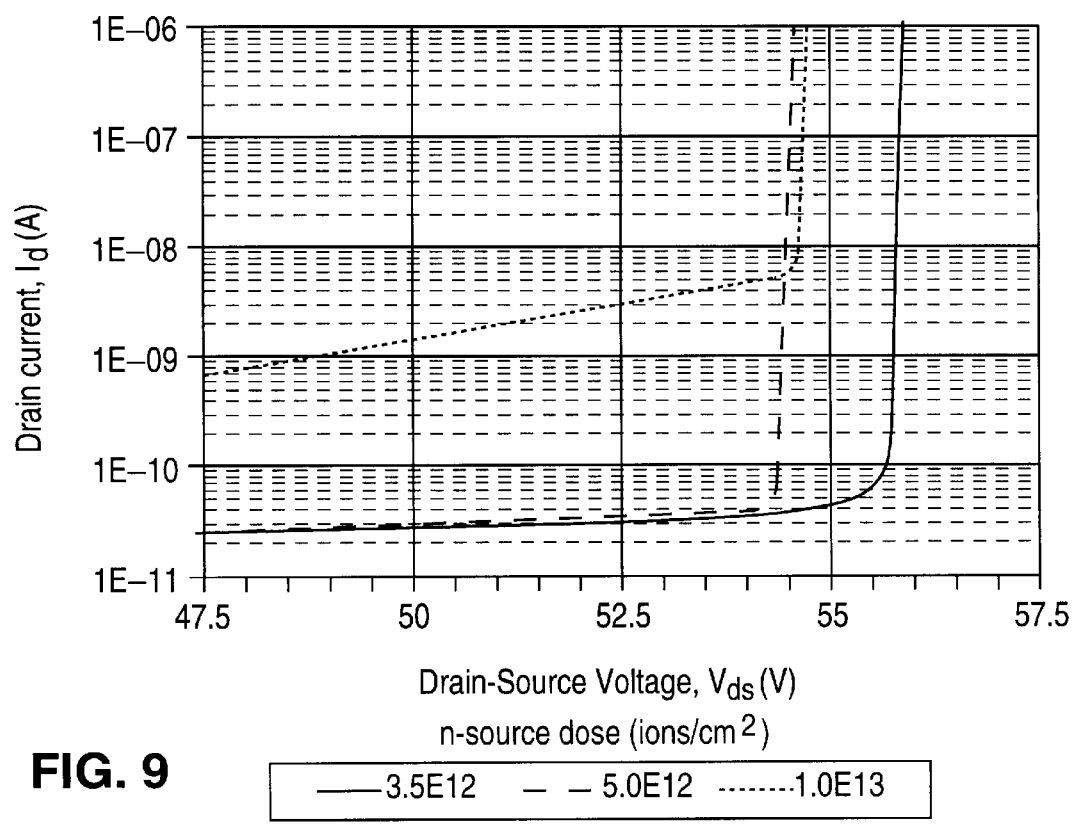
FIG. 9 plots drain current ($I_d$) versus drain-source voltage ($V_{ds}$) for a DMOS structure fabricated in accordance with the present invention, with increasing n-source dose.

To illustrate this, FIG. 9 plots drain current ($I_d$) versus drain-source voltage ($V_{ds}$) of a VDMOS structure fabricated in accordance with the present invention, with an increasing n-source dose. FIG. 9 reflects breakdown voltage characteristics with increasing n-source As doses of $3.5 \times 10^{12}$ ions/cm², $5.0 \times 10^{12}$ ions/cm², and $1.0 \times 10^{13}$ ions/cm². FIG. 9 reveals that the n-source dose must be less than $1.0 \times 10^{13}$ ions/cm² in order to maintain a low knee leakage current of <0.1 nA.

In order to identify process parameters leading to optimization of DMOS device characteristics, a four factor central composite circumscribed (CCC) experiment was conducted. As shown in TABLE 2 below, a large number of VDMOS devices were fabricated exhibiting an array of values for the following four control factors: 1) epitaxial thickness, 2) N-tub implant dose, 3) N-source implant dose, and 4) deep P+ implant dose.

TABLE 2

| # | Rur | Deep P+ | Epi t | N-Tub | N-source | Product |
|---|---|---|---|---|---|---|
| 1 | 1 | −1 | −1 | −1 | −1 | 1 |
| 2 | 2 | −1 | −1 | −1 | 1 | −1 |
| 3 | 3 | −1 | −1 | 1 | −1 | −1 |
| 4 | 4 | −1 | −1 | 1 | 1 | 1 |
| 5 | 5 | −1 | 1 | −1 | −1 | −1 |
| 6 | 6 | −1 | 1 | −1 | 1 | 1 |
| 7 | 7 | −1 | 1 | 1 | −1 | 1 |
|  | 8* | −1 | 1 | 1 | 1 | −1 |
| 8 | 9 | 1 | −1 | −1 | −1 | −1 |
| 9 | 10 | 1 | −1 | −1 | 1 | 1 |
| 10 | 11 | 1 | −1 | 1 | −1 | 1 |

TABLE 2-continued

| # | Rur | Deep P+ | Epi t | N-Tub | N-source | Product |
|---|---|---|---|---|---|---|
|  | 12* | 1 | −1 | 1 | 1 | −1 |
| 11 | 13 | 1 | 1 | −1 | −1 | 1 |
|  | 14* | 1 | 1 | −1 | 1 | −1 |
| 12 | 15 | 1 | 1 | 1 | −1 | 1 |
| 13 | 16 | 1 | 1 | 1 | 1 | 1 |
| 14 | 17 | 0 | 0 | 0 | −x |  |
| 15 | 18 | 0 | 0 | 0 | x |  |
| 16 | 19 | 0 | 0 | −x | 0 |  |
| 17 | 20 | 0 | 0 | x | 0 |  |
| 18 | 21 | 0 | −x | 0 | 0 |  |
| 19 | 22 | 0 | x | 0 | 0 |  |
| 20 | 23 | −x | 0 | 0 | 0 |  |
| 21 | 24 | x | 0 | 0 | 0 |  |
| 22 | 25 | 0 | 0 | 0 | 0 |  |
| 23 | 26 | 0 | 0 | 0 | 0 |  |
| 24 | 27 | x | 0 | 0 | x |  |

*Extreme opposites of Epi & N-tub, and/or high n-source will give useless data, and are substituted for center points. Note, all 3 exclusions are taken from one "half" of the factorial design, as indicated by the "product" column.

TABLE 3

| PARAMETER | VALUE |
|---|---|
| Thickness of Epi | 6.25 $\mu$m |
| N-tub implant dose | 8.5 × $10^{11}$ ions/cm$^2$ |
| Deep P+ implant dose | 3 × $10^{13}$ ions/cm$^2$ |
| N-source implant dose | 6 × $10^{12}$ ions/cm$^2$ |
| $BV_{dss}$ | 55–60 V |
| $R_{ds-on}$ | 0.5–0.55 $\Omega$ |
| $V_t$ | 0.7–0.8 V |
| $G_m$ | 0.07–0.08 $\Omega^{-1}$ |

While the present invention is illustrated in FIGS. 5A–5J and FIGS. 6–10B in conjunction with formation of a VDMOS structure, the present invention is also applicable to formation of LDMOS devices.

Figure 11:
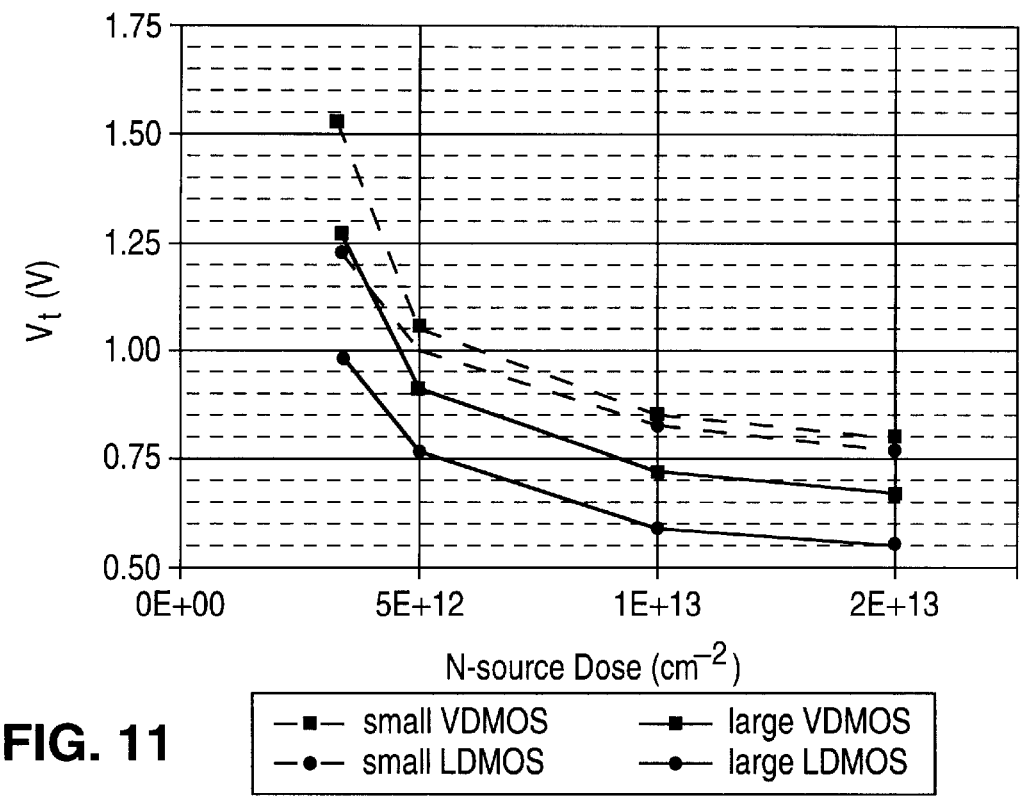
FIG. 11 plots $V_t$ versus n-source dose for large and small VDMOS and LDMOS arrays fabricated in accordance with the present invention.

FIG. 11 plots $V_t$ versus n-source dose for large (0.945 mm$^2$) and small (0.025 mm$^2$) VDMOS and LDMOS arrays fabricated in accordance with the present invention. FIG. 11 reveals the device behavior depicted in FIG. 9 to be consistent across both small and large VDMOS and LDMOS arrays. FIG. 11 also reveals that the process flow in accor-

KEY TO TABLE 2

| | 3 levels | | | Axial points | | | y = mx + c | |
|---|---|---|---|---|---|---|---|---|
| Variable | −1 | 0 | 1 | −x | x | Mult. | m | c |
| Deep P+ | 1.0E + 13 | 1.0E + 14 | 1.9E + 14 | 1.0E + 12 | 2.0E + 14 | 1.1 | 9E + 13 | 1E + 14 |
| Epi t | 6.5 | 7 | 7.5 | 6.25 | 7.75 | 1.5 | 0.5 | 7 |
| N-tub | 5.0E + 11 | 7.0E + 11 | 9.0E + 11 | 4.0E + 11 | 1.0E + 12 | 1.5 | 2E + 11 | 7E + 11 |
| N-source | 4.4E + 12 | 6.0E + 12 | 7.6E + 12 | 4.0E + 12 | 8.0E + 12 | 1.3 | 1.6E + 12 | 6E + 12 |

The four electrical responses, $BV_{dss}$, $R_{ds\_on}$, $V_t$, and $G_m$, were measured for each device. These response values, together with the corresponding epitaxial thicknesses, N-tub implant doses, N-source implant doses, and deep P+ implant doses, were entered into a statistical analysis software program. Specifically, SAS/STAT version 6.11, by SAS Institute Inc. of Carey, N.C., was used. Based upon this input, the statistical analysis program created a quadratic equation predicting the behavior of each electrical response $BV_{dss}$, $R_{ds\_on}$, $V_t$, and $G_m$, depending upon the process parameters listed. Once the quadratic equations were generated by statistical analysis, these equations were modeled and visualized utilizing the MATHCAD version 6 computer program, by Mathsoft, Inc. of Cambridge, Mass.

Figure 10A:
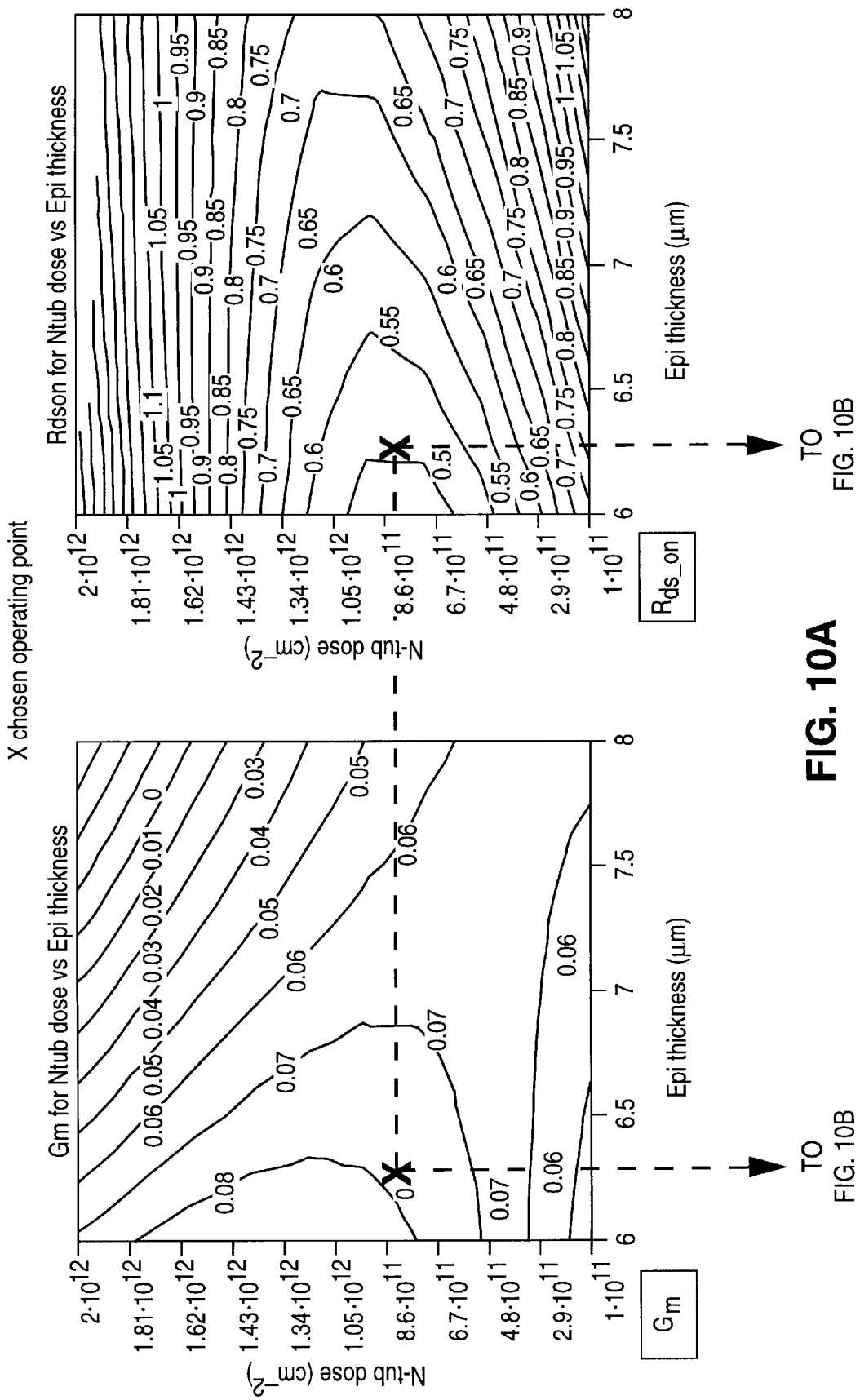
FIGS. 10A and 10B plot the response surface modelling results of experimental optimization of the device parameters $R_{ds\_on}$, $V_t$, drain-substrate breakdown voltage ($BV_{dss}$), and transconductance ($G_m$) for VDMOS devices fabricated under a variety of process parameters in accordance with the present invention.
Figure 10B:
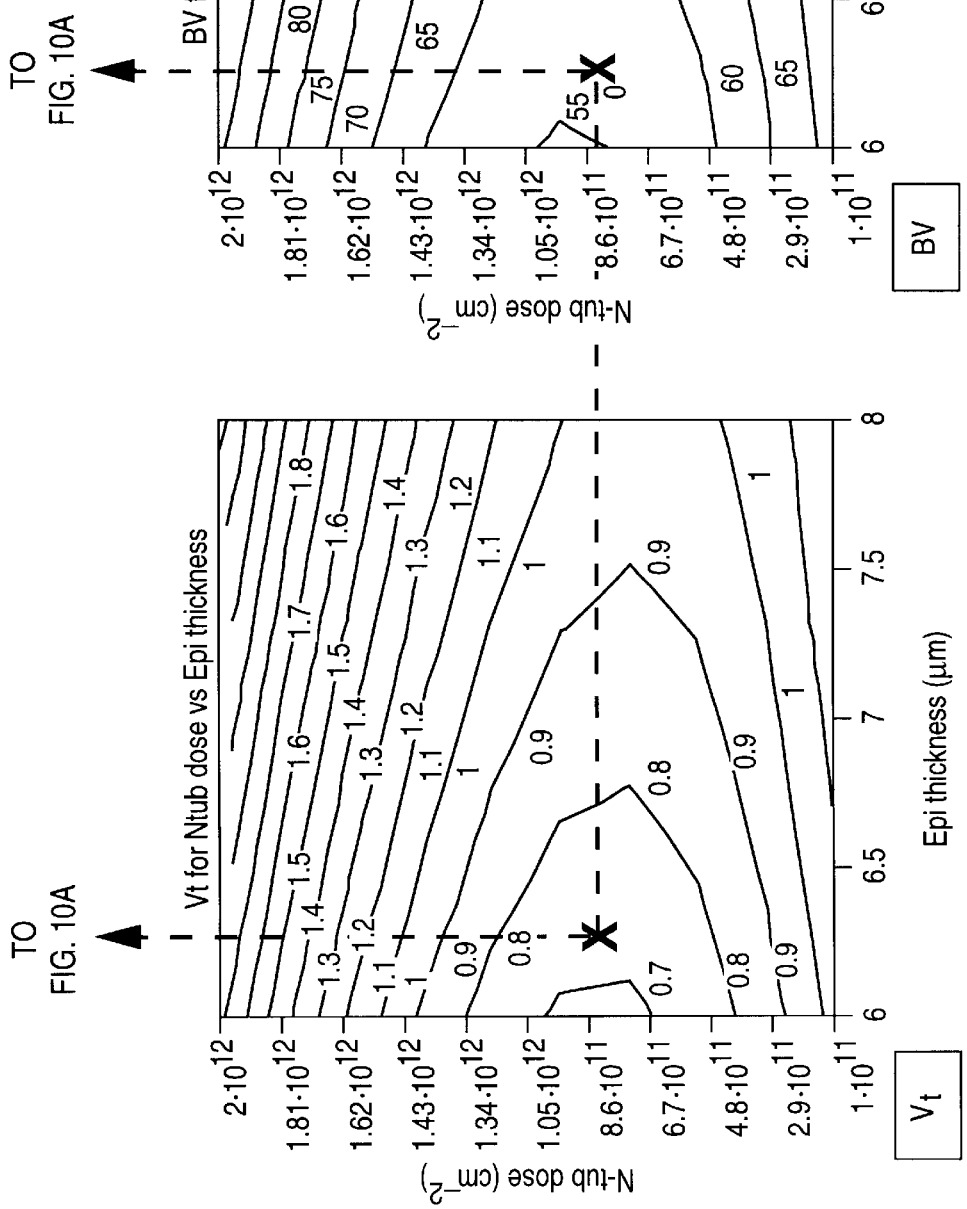

FIGS. 10A and 10B plot the response surface modelling results in the form of contour diagrams produced by MATH-CAD which reflect the final determined optimized operating point. For these contour diagrams, the N-source implant dose of 6×10$^{12}$ ions/cm$^2$ was selected based upon measured leakage characteristics. The deep P+ implant dose of 3×10$^{13}$ ions/cm$^2$ was selected after viewing MATHCAD animations of the mathematical surfaces produced by the interaction of the quadratic equations. The final optimized process and device parameters achieved by the experiment are summarized in TABLE 3.

dance with the present invention appears to be sensitive to n-source dose for n-source doses below about 0.5×10$^{13}$ ions/cm$^2$. Simulation predicted a breakdown voltage of 55V under these conditions. Once calibrated to $V_t$, the data was consistent.

Figure 12:
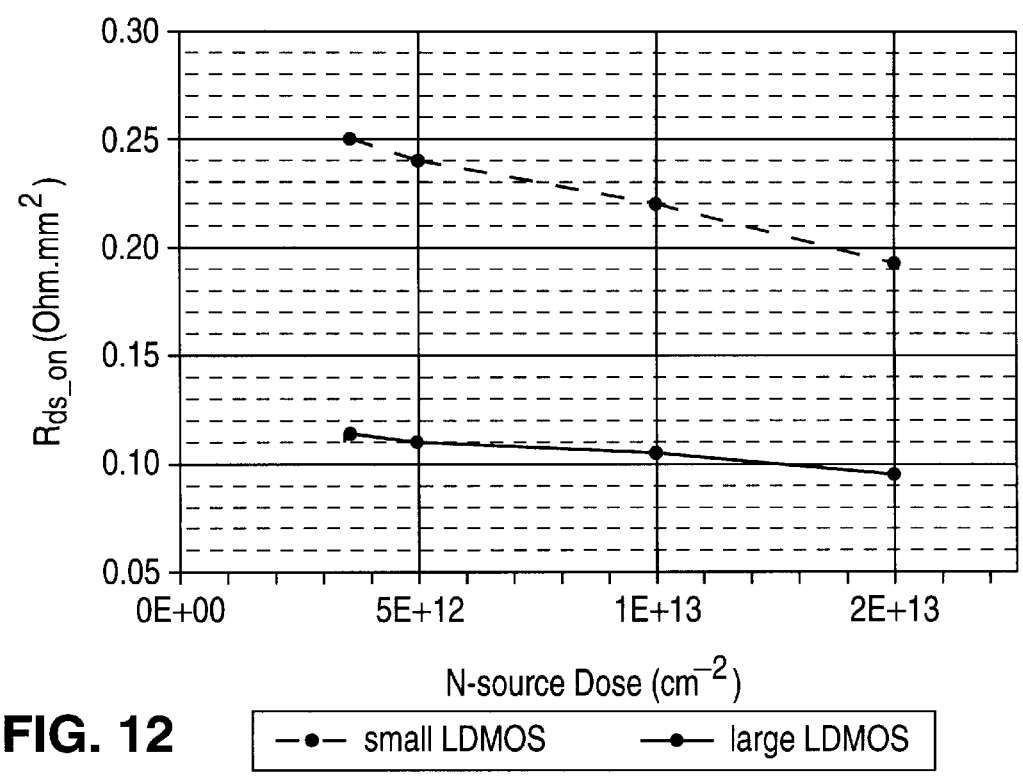
FIG. 12 plots $R_{ds\_on}$ versus n-source dose for small and large LDMOS arrays fabricated in accordance with the present invention.

FIG. 12 plots "on" drain-source resistance ($R_{ds\_on}$) versus n-source dose, for small and large LDMOS arrays of depicted in FIG. 11. FIG. 12 shows that for a gate-source voltage $V_{GS}$=5V, $R_{ds\_on}$ decreases with increasing n-source dose for both the small and large LDMOS arrays (2.2 $\mu$m gate length). FIG. 12 also reveals that for the large LDMOS array, $R_{ds\_on}$ is relatively insensitive to n-source dose.

It is intended that the following claims define the scope of the present invention, and that the methods and structures within the scope of these claims and their equivalents be covered hereby.

What is claimed is:

1. A method of fabricating a DMOS transistor structure, the DMOS transistor structure including an active semiconductor substrate region having a tub of N-type conductivity formed therein, the N-type tub being formed over an N$^+$ buried region, the method comprising:

forming a deep P$^+$ mask over the active semiconductor substrate region, the deep P$^+$ mask having an opening over a first central portion of the N type tub;

implanting dopant of P-type conductivity into the first central region to form a deep P$^+$ region within the N-type tub;

removing the deep P$^+$ mask;

forming a P-body mask on the semiconductor substrate, the P-body mask having an opening over a second central portion of the N-type tub, the second central portion encompassing the first central portion;

implanting dopant of P-type conductivity into the second central region to form a P-body region in the N-type tub such that the P-body region is contiguous with the deep P+ region;

utilizing the P-body mask to perform a self-aligned ion implant of dopant of N-type conductivity to form an N-source region in the P-body region, the P-body mask being thick enough to block the N-source implant at the periphery of the P-body region;

removing the P-body mask;

performing a thermal drive-in step resulting in diffusion of dopant implanted in the deep P+ region, the P-body region, and the N-source region;

forming a layer of gate oxide over the N-type tub, including over the P-body region and the N-source region;

forming a layer of polysilicon over the gate oxide layer;

etching the polysilicon layer to define polysilicon gates overlapping a first interface between the N-source region and the P-body region and also overlapping a second interface between the P-body region and the N-type tub;

forming oxide sidewall spacers on the sidewalls of the polysilicon gates;

forming an N+ mask over the structure resulting from the above-defined steps, the N+ mask having an opening over a third central region between the oxide sidewall spacers and an edge of the N+ mask;

performing a self-aligned implant of N-type dopant into the third central region;

forming a P+ mask over the structure resulting from the above-defined steps, the P+ mask including an opening formed over a fourth central region adjacent to the third central region; and performing an implant of P-type dopant into the fourth central region to thereby create a region of P-type conductivity in the N-source which defines first and second spaced-apart N-type source regions of the DMOS transistor structure.

2. The method according to claim 1 further comprising the steps of:

forming an N+ sinker region at an edge of the N-type tub, the N+ sinker region extending from a surface of the N-type tub to the N+ buried region; and implanting N type dopant into the N tub to form a sinker contact region.

3. The method according to claim 2 further comprising the steps of:

forming a pad oxide layer on the N-tub and on the N+ sinker region;

forming a composite mask on the silicon nitride layer, the composite mask including etched openings such that the surface of the periphery of the N-type tub is exposed and the interface between the N-type tub and the N+ sinker region is exposed; and utilizing the composite mask to form field oxide isolation regions in the semiconductor substrate region at the periphery of the N-type tub and at the interface between the N-type tub and the N+ sinker region.

4. The method according to claim 1 further comprising the steps of:

forming an N+ drain region in the N tub adjacent to the polysilicon gates.

5. The method according to claim 1 wherein the step of forming the deep P+ region occurs prior to the step of forming the P-body mask.

* * * * *

UNITED STATES PATENT AND TRADEMARK OFFICE
CERTIFICATE OF CORRECTION

PATENT NO. : 6,069,034
DATED : May 30, 2000
INVENTOR(S) : Dr. Haydn James Gregory It is certified that error appears in the above-identified patent and that said Letters Patent is hereby corrected as shown below:

Column 12,
Line 15, delete "2" and insert -- 1 -- in lieu thereof.

Signed and Sealed this

Twenty-third Day of October, 2001

*Attest:*

NICHOLAS P. GODICI
*Attesting Officer*   Acting Director of the United States Patent and Trademark Office